(12) United States Patent
Kim et al.

(10) Patent No.: US 12,046,691 B2
(45) Date of Patent: Jul. 23, 2024

(54) PHOTOVOLTAIC MODULE

(71) Applicant: KOREA UNIVERSITY RESEARCH AND BUSINESS FOUNDATION, Seoul (KR)

(72) Inventors: Donghwan Kim, Yangpyeong-gun (KR); Yoonmook Kang, Seoul (KR); Yongseok Jun, Seoul (KR); Hae-Seok Lee, Seoul (KR); Yujin Jung, Seoul (KR); Jongwon Ko, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/872,480

(22) Filed: Jul. 25, 2022

(65) Prior Publication Data

US 2022/0359775 A1    Nov. 10, 2022

Related U.S. Application Data (63) Continuation of application No. PCT/KR2020/018960, filed on Dec. 23, 2020.

(30) Foreign Application Priority Data

Feb. 21, 2020 (KR) .................. 10-2020-0021440

(51) Int. Cl.
*H01L 31/0468* (2014.01)
*H01L 31/0232* (2014.01)
*H02S 20/26* (2014.01)

(52) U.S. Cl.
CPC .... *H01L 31/0468* (2014.12); *H01L 31/02327* (2013.01); *H02S 20/26* (2014.12)

(58) Field of Classification Search
None
See application file for complete search history.

(56) References Cited

U.S. PATENT DOCUMENTS

2012/0234371 A1* 9/2012 Zhang ................ H01L 31/0547
                                                                                136/246
2012/0273030 A1* 11/2012 Jee ...................... H01L 31/0504
                                                                                136/251

FOREIGN PATENT DOCUMENTS

| EP | 2 339 643 A2 | 6/2011 | |
|---|---|---|---|
| JP | 2014-96511 A | 5/2014 | |
| JP | 6429002 B2 | 11/2018 | |
| KR | 10-0765965 B1 | 10/2007 | |
| KR | 10-2011-0000773 A | 1/2011 | |
| KR | 10-2011-0074306 A | 6/2011 | |
| KR | 10-2012-0117085 A | 10/2012 | |
| KR | 10-2012-0137947 A | * 12/2012 | .......... H01L 31/042 |
| KR | 10-2012-0137947 A | 12/2012 | |
| KR | 10-2013-0052421 A | 5/2013 | |
| KR | 10-2013-0059170 A | 6/2013 | |
| KR | 10-2013-0102204 A | 9/2013 | |

(Continued)

OTHER PUBLICATIONS

English machine translation of Pak (KR10-2012-0137947A) provided by the EPO website, All Pages, 2023. (Year: 2023).*

*Primary Examiner* — Daniel P Malley, Jr.
(74) *Attorney, Agent, or Firm* — NSIP Law (57) ABSTRACT

Disclosed is a photovoltaic module including a transparent material layer, and a plurality of solar cells disposed inside one side of the transparent material layer, and at least one of the plurality of solar cells is disposed to be perpendicular to one side surface of the transparent material layer.

6 Claims, 10 Drawing Sheets

(56) References Cited

FOREIGN PATENT DOCUMENTS

KR          10-1948993 B1    2/2019
KR   10-2019-0089404 A    7/2019

\* cited by examiner

Horizontal arrangement

FIG. 5B

Vertical arrangement

PHOTOVOLTAIC MODULE

CROSS-REFERENCE TO RELATED APPLICATIONS

Pursuant to 35 USC 120 and 365(c), this application is a continuation of International Application No. PCT/KR2020/018960 filed on Dec. 23, 2020, and claims the benefit under 35 USC 119(a) of Korean Application No. 10-2020-0021440 filed on Feb. 21, 2020, in the Korean Intellectual Property Office, the entire disclosures of which are incorporated herein by reference for all purposes.

STATEMENT REGARDING GOVERNMENT SPONSORED RESEARCH OR DEVELOPMENT

The invention concept is derived from research conducted as part of 'Development of a transparent solar cell platform that is easy to expand'(Project Identification Number: 20193091010240, Research Management Institution: National Research Foundation of Korea, Research Project Title: transparent solar cell platform development with easy expansion, Host Institution: Korea University Industry-University Cooperation Foundation, Research Period: 2019 Sep. 1~2021 May 31, Contribution Rate: ½) of the MTI (Ministry of Trade and Industry).

The invention concept is derived from research conducted as part of 'Super Solar Cell Overcoming the Theoretical Limit Efficiency (30%) of Silicon Solar Cells'. (Project Identification Number: 20193091010490, Research Management Institution: National Research Foundation of Korea, Research Project Title: transparent solar cell platform development with easy expansion, Host Institution: Korea University Industry-University Cooperation Foundation, Research Period: 2019 Sep. 1~2021 May 31, Contribution Rate: ½) of the MTI (Ministry of Trade and Industry).

There is no property interest of the Korean government in any aspect of this invention.

TECHNICAL FIELD

The present disclosure relates to a photovoltaic module.

BACKGROUND ART

In general, a solar system is a system that converts light energy into electric energy by using solar cells, and is used as an independent power source for general homes or the industries or is used as an auxiliary power source in association with systems of normal AC power sources.

The solar cells are manufactured through p-n junctions of semiconductor materials by using diffusion, and uses a photovoltaic effect, in which a small amount of currents flow under light, and most of general solar cells include p-n junction diodes of large areas, and are applied as unit solar cells or cells when electromotive forces generated at opposite ends of the p-n junction diodes are connected to an external circuit. Because the electromotive forces of the solar cells are low, a plurality of solar cells are connected to each other to constitute a photovoltaic module having an appropriate electromotive force.

A system associated solar system used for a generally used building mounted type includes a plurality of solar cell arrays that convert solar energy into electric energy, and an inverter that converts DC power corresponding to electric energy obtained through conversion in the solar cell arrays to AC power and supplies the AC power to a place of demand.

In the solar system, installation of the solar cell arrays installed to obtain energy of the sunlight is the most important element in a configuration of the system, and the solar cell arrays are installed at a separately secured place or are installed on the roof of a building.

Accordingly, a separate space has to be secured to install the solar system in a building, but a cooling tower that constitutes a cooling device is generally installed on the roof of the building, and thus a place for installing the solar cell arrays is narrow and limited whereby the installation of the solar cell arrays is restricted and the installation operation is difficult.

There is a case, in which a solar system is applied to a window system installed for lighting and ventilation of a building to supplement the disadvantage.

That is, Korean Patent No. 10-0765965 discloses a window using solar cells.

A conventional window using solar cells will be described with reference to FIG. 1.

Figure 1:
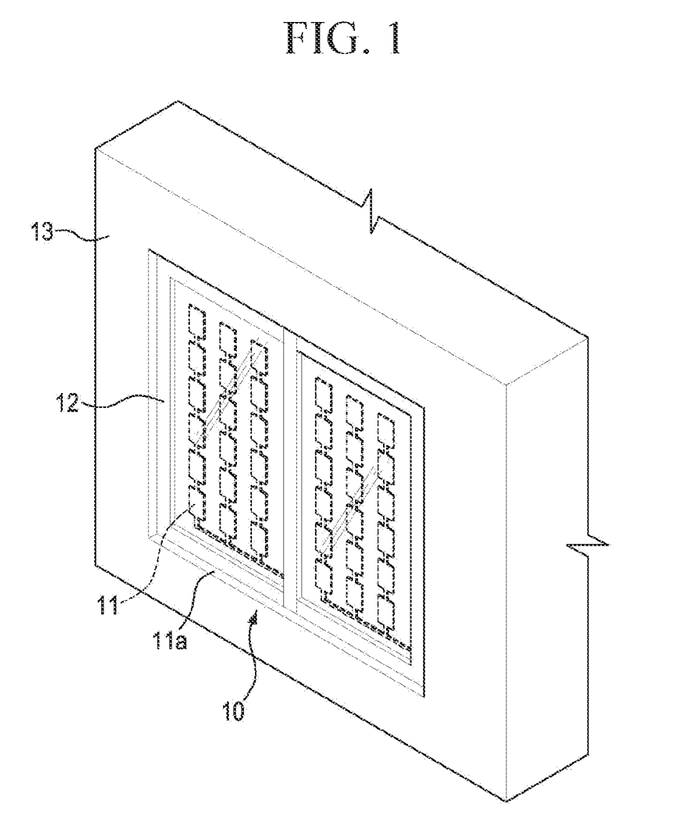
FIG. 1 is a perspective view of a conventional window.

FIG. 1 is a perspective view of a conventional window.

Referring to FIG. 1, a conventional window 10 includes a solar cell array 11 that converts solar energy into electric energy, and a frame 11a coupled to a periphery of the solar cell array 11 and mounted in an opening 13 of a wall body 12 of the building.

That is, the conventional window 10 has a structure, in which the solar cell array 11 is fixed to an inner central portion of the frame 11a having a rectangular shape, and an outer glass window located on an outer side of the wall body 12 of the building and an inner glass window located on an inner side thereof are disposed on a front side and a rear side of the solar cell arrays 11 to be spaced apart from the solar cell array 11 by a specific distance and are fixed.

Meanwhile, a device such as a blind or a vertical may be separately installed for privacy when most of the windows are installed, and costs therefor are not low.

In this way, conventionally, the windows and the blinds are separately provided and thus costs or spaces are not efficient.

In recent years, methods for directly installing the blinds to the glass of the building for installation have been suggested.

Figure 2:
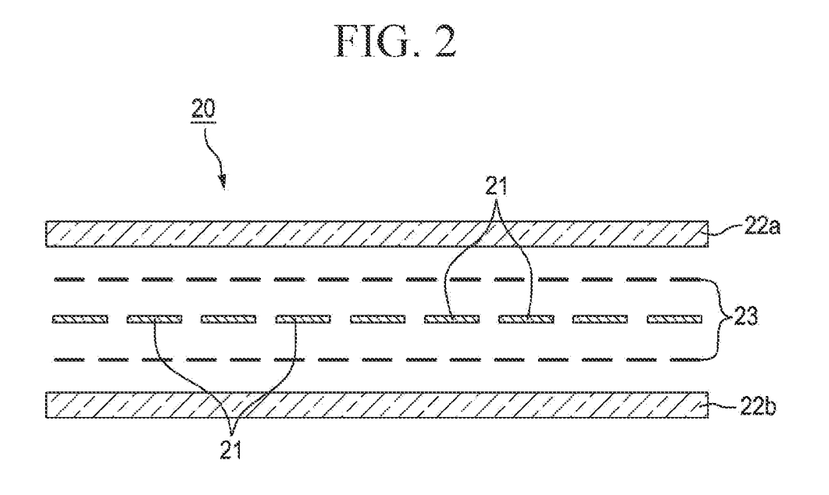
FIG. 2 is a cross-sectional view illustrating a conventional photovoltaic module.

That is, as illustrated in FIG. 2, it is manufactured by disposing a plurality of solar cells 21 including crystalline or multi-crystalline between reinforced glass boards 22a and 22b, and attaching them by using EVS films 23.

Figure 3:
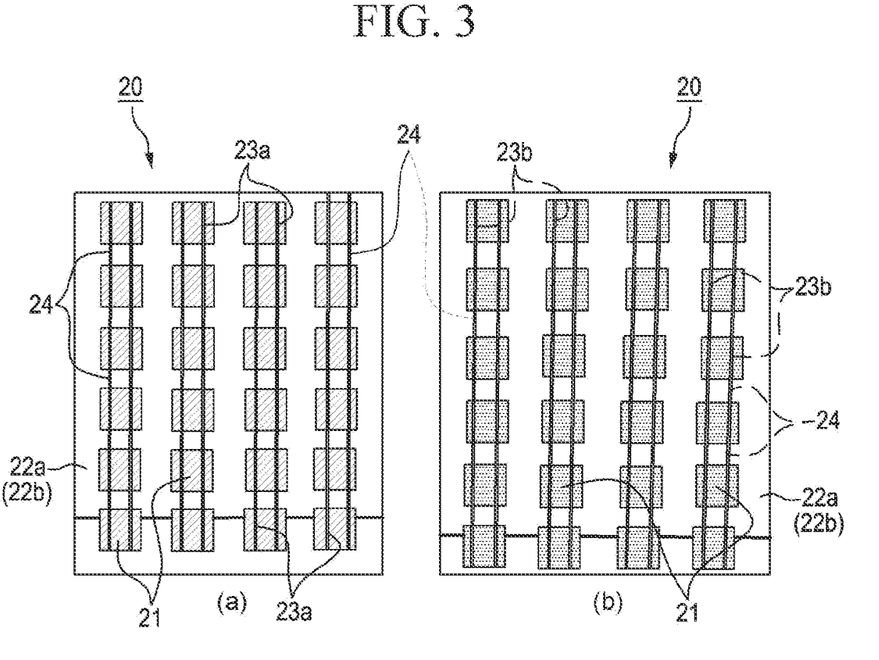
FIG. 3 is a front view illustrating a conventional photovoltaic module.

Generally, a front surface of the conventional photovoltaic module 20 manufactured in this way has a blue color or a black color as illustrated in (a) of FIG. 3, and a rear surface thereof mostly has a gray color as illustrated in (b) of FIG. 3.

In the conventional photovoltaic module 20, two electrode lines of a width of 3 mm to 5 mm are formed of silver paste Ag through screen printing to form the electrode line 23b on a rear surface of the solar cell 21 and are dried in a roll conveyor employing an infrared (IR) lamp. The color of the electrode line 23b dried in this way is close to a bright gray color.

The solar cells 210 are manufactured by joining an N-type material to a P-type wafer or a P-type material to an N-type wafer. When a P-type is used, rear surfaces of the solar cells 210 have a plus (+) polarity and front surfaces thereof have a minus (−) polarity.

When the photovoltaic module 20 is manufactured by using the solar cells 21, the solar cells 21 are connected to each other in series or in parallel.

Then, an interconnector ribbon 24 is used to connect the solar cells 21, a material of the connection ribbon 24 generally includes Sn+Pb+Ag, Sn+Ag, and Sn+Ag+Cu, and in the case of series connections, a silver paste electrode line 23a of a minus (−) polarity (an negative electrode in the case of the P-type and a positive electrode in the case of the N-type) of a width of 1 mm to 3 mm, which is formed on the front surface of the solar cell 21, is connected to a silver paste electrode line 23b of a plus (+) polarity (a positive electrode in the case of a p− type and a negative electrode in the case of an n− type) of a width of 3 mm to 5 mm, which is formed on the rear surface of another solar cell through the interconnector ribbon 24.

In this way, the interconnector ribbon 24 that connect the solar cells 21 has a width of 1.5 mm to 3 mm and a thickness of 0.01 to 0.2 mm.

The connection methods include an indirect connection method by an IR lamp, a halogen lamp, and hot air and a direct connection method by an iron.

Meanwhile, the EVA film 23 located between glass boards 22a and 22b of the photovoltaic module 20 starts to be melted at a temperature of 80° C. and becomes clear and transparent at a temperature of about 150° C., joins the solar cells 21 and the glass boards, and prevents corrosion or a short-circuit of the silver electrodes 23a and 23b and the ribbons 24 of the solar cells by preventing external moisture and air that face the solar cells 21 from penetrating.

The EVA film 23 is melt between the dually jointed glass boards 22a and 22b of the photovoltaic module 20 to be viewed clearly and transparently when being laminated by a laminator (not illustrated), and then, the remaining portions, except for the solar cells 21 and the connection ribbons 24, are viewed clearly.

The conventional photovoltaic module 20 for PIPV is manufactured by using crystalline or multi-crystalline solar cells 21, and is disposed between the dual glass boards 22a and 22b of the building to be viewed from an inside and an outside of the building as it is.

Double-side light-reception type or single surface light-reception type solar cells 21 are used for the solar cells 21 of the photovoltaic module 20 mounted on the building in this way. A color of the light receiving surfaces of the solar cells 21 have a color in a process of depositing a reflection preventing film due to a PECVD and APCVD (not illustrated) that is a vacuuming facility. Generally, the surface has a blue color or a black color, but the rear surfaces of the single surface light reception type cells have a gray color because it is formed of aluminum (Ai) through a vacuuming facility (not illustrated) or screen printing to form an electrode.

Furthermore, in the conventional photovoltaic module 20, several or several tens of solar cells 21 are connected by the interconnector ribbons 24 in the interiors of the glass boards 22a and 22b, and the interconnector ribbons 24 are not maintained straight constantly and are deflected and curved.

In this state, when the photovoltaic module is finished through lamination, the shapes of the interconnector ribbons 24 that connect the solar cells 21 in the glass boards 22a and 22b are deflected and uneven as a whole.

Furthermore, the color of the interconnector ribbons 24 of the conventional photovoltaic module 20 is silver, and when the photovoltaic module 20 for BIPV is manufactured, the interconnector ribbons 24 have the original color and the front and rear surfaces thereof are exposed in silver.

Accordingly, in the conventional photovoltaic module 20, the rear surface (non-light receiving surface) thereof and the interconnector ribbons 24 have a gray color and a silver color, and because the silver color of the interconnector ribbons 240 is exposed to an outside through the front glass boards 22a and 22b on a front surface (the light receiving surface) of the photovoltaic module 20, the gray and silver colors of the rear surface (the non-light receiving surface) is viewed as it is, and the lines of the interconnector ribbons 24 are deflected and curved when the dually joined photovoltaic module 20 is manufactured, an aesthetic aspect thereof is not good when the photovoltaic module 20 is attached instead of glass of city buildings.

DETAILED DESCRIPTION OF THE INVENTION

Technical Problem

An aspect of the present disclosure provides a photovoltaic module that may enhance collection rates of visible rays, near-infrared rays, and ultraviolet rays by installing solar cells in a transparent material layer or a transparent material layer joined to glass in a horizontal arrangement, may enhance collection rates by installing the solar cells at an equal interval in a vertical line direction that corresponds to a horizontal arrangement with the transparent material layer or the glass, and may secure transparent visibility by installing the solar cells in a range that is not interfered in a range of a field of view of a person.

An aspect of the present disclosure also provides a photovoltaic module that provides a parallel and series connection structure, in which a thin film solar cell is manufactured to have a size of micrometers, a space, through which light may pass, is provided between the solar cells, and the unit cells may be connected to each other in series and in parallel in a manufacturing process.

An aspect of the present disclosure also provides a photovoltaic module that may realize excellent color rendering for a color that is close to natural light based on a high average transmission rate of a wide-band visual ray area, through solar cells.

An aspect of the present disclosure also provides a photovoltaic module, in which a plurality of concentrators are installed in spaces between solar cells in an interior of a transparent material layer to enhance light absorption efficiency by reemitting absorbed light.

The technical problems that are to be solved by the present disclosure are not limited to the above-mentioned ones, and the other technical problems that have not been mentioned will be clearly understood from the following description by an ordinary person in the art, to which the present disclosure pertains.

Technical Solution

According to an embodiment, a photovoltaic module includes a transparent material layer, and a plurality of solar cells disposed inside one side of the transparent material layer, at least one of the plurality of solar cells is disposed to be perpendicular to one side surface of the transparent material layer.

Furthermore, the transparent material layer may be divided into an intermediate area, a lower area, and an upper area in a height direction, and the at least one of the plurality of solar cells, which is disposed to be perpendicular to the one side surface of the transparent material layer, may be disposed in the intermediate area.

Furthermore, the solar cells disposed in the lower area and the upper area may be disposed to be inclined toward the intermediate area.

Furthermore, the plurality of solar cells may be disposed to be perpendicular to the one side surface of the transparent material layer.

Furthermore, the transparent material layer may be divided into an intermediate area, a lower area, and an upper area in a height direction, and a density of the solar cells disposed in the intermediate area may be higher than a density of the solar cells disposed in the lower area and the upper area.

Furthermore, the transparent material layer may be divided into an intermediate area, a lower area, and an upper area in a height direction, and a width of the solar cells disposed in the intermediate area may be higher than a width of the solar cells disposed in the lower area and the upper area.

Furthermore, the one side surface of the transparent material layer may have a preset radius of curvature, and the plurality of solar cells may be disposed in parallel to an imaginary line that connects an origin of the radius of curvature and the one side surface of the transparent material layer.

Furthermore, the one side surface of the transparent material layer may be inclined, and the plurality of solar cells may be disposed in parallel to each other.

Furthermore, the photovoltaic module may further include a glass layer disposed on an opposite side surface of the transparent material layer.

Furthermore, the photovoltaic module may further include a concentrator disposed in the transparent material layer.

Advantageous Effects of the Invention

According to an embodiment of the present disclosure, collection rates of visible rays, near-infrared rays, and ultraviolet rays may be enhanced by installing solar cells in a transparent material layer or a transparent material layer joined to glass in a horizontal arrangement, collection rates may be enhanced by installing the solar cells at an equal interval in a vertical line direction that corresponds to a horizontal arrangement with the transparent material layer or the glass, and transparent visibility may be secured by installing the solar cells in a range that is not interfered in a range of a field of view of a person.

Furthermore, according to an embodiment of the present disclosure, a transmission rate for a visual ray of a wide band may be absorbed in balance by horizontally arranging solar cells in a transparent material layer.

Furthermore, according to an embodiment of the present disclosure, excellent color rendering for a color that is close to natural light may be realized based on a high average transmission rate of a wide-band visual ray area, through solar cells Furthermore, according to an embodiment of the present disclosure, a plurality of concentrators may be installed in spaces between solar cells in an interior of a transparent material layer to enhance light absorption efficiency by reemitting absorbed light The advantageous effects of the present disclosure are not limited to the above-mentioned ones, and the other advantageous effects will be clearly understood by an ordinary person skilled in the art to which the present disclosure pertains.

BEST MODE

Hereinafter, embodiments of the present disclosure will be described in detail with reference to the accompanying drawings. The embodiments of the present disclosure may be modified in various forms, and the scope of the present disclosure should not be construed to be limited to the following embodiments. The embodiments of the present disclosure are provided to describe the present invention for those skilled in the art more completely. Accordingly, the shapes of the components of the drawings are exaggerated to emphasize clearer description thereof.

The configurations of the present disclosure for clearly describing a solution for the problem that is to be solved by the present disclosure will be described in detail with reference to the accompanying drawings based on a preferred embodiment of the present disclosure, in which the same reference numerals are given for the same elements in denoting the reference numerals for the elements even though they are present in different drawings, and when a drawing has to be referenced for a description of the embodiment, the elements in another drawing also may be cited.

Figure 4:
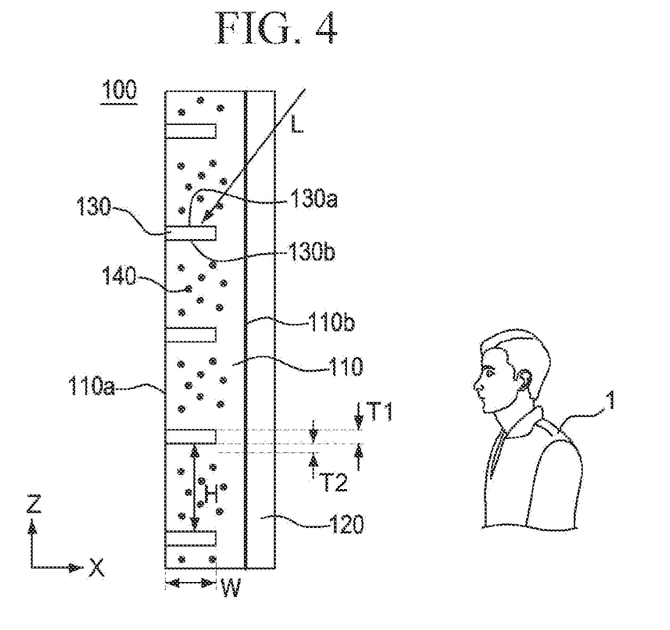
FIG. 4 is a diagram illustrating a first embodiment of a photovoltaic module of the present disclosure.

FIG. 4 is a diagram illustrating a first embodiment of a photovoltaic module of the present disclosure.

First, referring to FIG. 4, a photovoltaic module 100 according to the first embodiment of the present disclosure may include a transparent material layer 110, a glass layer 120, solar cells 130, and concentrators 140.

The transparent material layer 110 may have a thin film shape that has a length in a height direction (the Z axis direction), and may be formed of a light transmitting material.

Here, the transparent material layer 110 includes one side surface 110a, and an opposite side surface 110b that is an opposite surface to the one side surface 110a, in a widthwise direction (the X axis direction).

The glass layer 120 may be joined to the opposite side surface 110b of the transparent material layer 110 to face a user 1. The glass layer 120 not only may be applied as a window while showing transparent characteristics but also may enhance an efficiency of insulation energy.

The solar cells 130 may be disposed in a shape that is inserted into one side of the transparent material layer 110.

Here, the solar cells 130 may have a shape with a thickness "T" and a width "W".

For example, thin film type solar cells 130 having a thickness of 10 nm to 10 μm or silicon solar cells 130 having a thickness of 50 μm to 300 μm may be applied as the solar cells 130.

In detail, the kinds of the solar cells 130 applied in the present disclosure are not limited, but silicon solar cells and the like may be applied in the present disclosure.

That is, the silicon solar cells may be variously classified according to thin film deposition temperatures, kinds of boards used, and deposition schemes, and may be largely classified into multi-crystalline and crystalline silicon solar cells according to crystal characteristics of the light absorbing layer.

A crystalline solar cell that is a representative silicon solar cell is a solar cell, a board of which is made of a crystalline silicon wafer. Furthermore, the silicon solar cell is manufactured to have a multi-junction structure, such as a tandem, in which a solar cell that absorbs light of another wavelength is stacked on a silicon solar cell, or a triple junction, in which a solar cell that absorbs light of still another wavelength is stacked thereon, or to have a hybrid structure to increase a conversion efficiency to a level of a silicon solar cell or more.

The solar cells 130, to which the silicon solar cells having the above characteristics are applied, are inserted into or injection-molded in the transparent material layer 110 to have transparent characteristics.

In the present disclosure, the solar cells 130 are installed in a horizontal arrangement that is perpendicular to a height direction of the transparent material layer 110, and are installed in a range, in which they are neither hindered by interferences of an incident angle of sunlight nor interfered in a range of a field of view of the user 1.

Meanwhile, the solar cells 130 may include a plurality of solar cells 130 that are disposed to be spaced apart from each other in a height direction (the axis direction).

Here, the plurality of solar cells 130 are preferably disposed to be spaced apart from each other at an equal interval, and are installed in a horizontal arrangement in the transparent material layer 110 in a range, in which they are not interfered in a range of a field of view of the user 1.

Here, the horizontal arrangement means that they are disposed to have a width in a widthwise direction (the X axis direction) that is perpendicular to the one side surface 110a of the transparent material layer 110 in an upright state in the height direction (the Z axis direction).

Meanwhile, the perpendicular relationship in the first embodiment of the present disclosure may mean that an angle therebetween is an angle (for example, 80° to 100°) that is adjacent to a right angle.

However, a range of the angle that defines the perpendicular relationship is not limited in the present disclosure.

Furthermore, a visual ray, a near-infrared, and an ultraviolet pass through a transparent material layer in spaces between the solar cells 130.

It is apparent that the light passes through the transparent material layer 110 whereby visibility is secured and the transmission property of the transparent material layer 110 is guaranteed because there is no interference due to a field of view through gaps between the solar cells 130.

Meanwhile, the solar cells 130 may be of a double-side light reception type as described above, but in the embodiment of the present disclosure, the solar cells 130 may have light receiving surfaces 130a such that the light receiving surfaces 130a face an upper side and have non-light receiving surfaces 130b such that the non-light receiving surfaces 130b face a lower side.

That is, the solar cells 130 may be installed in a horizontal arrangement in the transparent material layer 110, and may collect the input sunlight L through the light receiving surfaces 130a and may perform a photovoltaic conversion.

The concentrators 140 may be disposed in a form of a plurality of nano particles in the transparent material layer 110, and may disperse the input sunlight "L" and concentrate the light toward the solar cells 130, and through this, may enhance photovoltaic efficiency.

Luminescent solar concentrators (LSCs) may be applied as the concentrators 140.

Hereinafter, characteristics of the photovoltaic module 100 according to the first embodiment of the present disclosure will be described with reference to FIGS. 5 to 8.

Figure 5A:
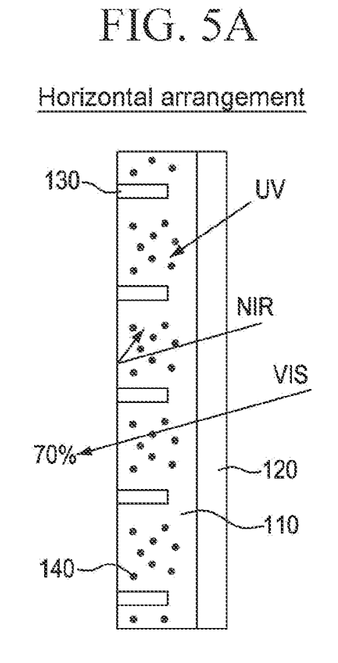
FIGS. 5A and 5B are diagrams illustrating comparison of horizontal arrangement and vertical arrangement states of solar cells.
Figure 5B:
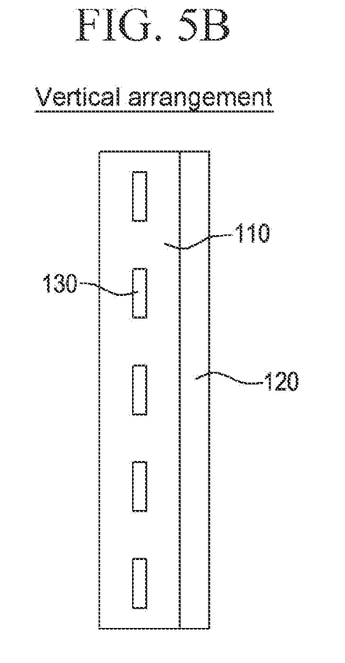
Figure 6A:
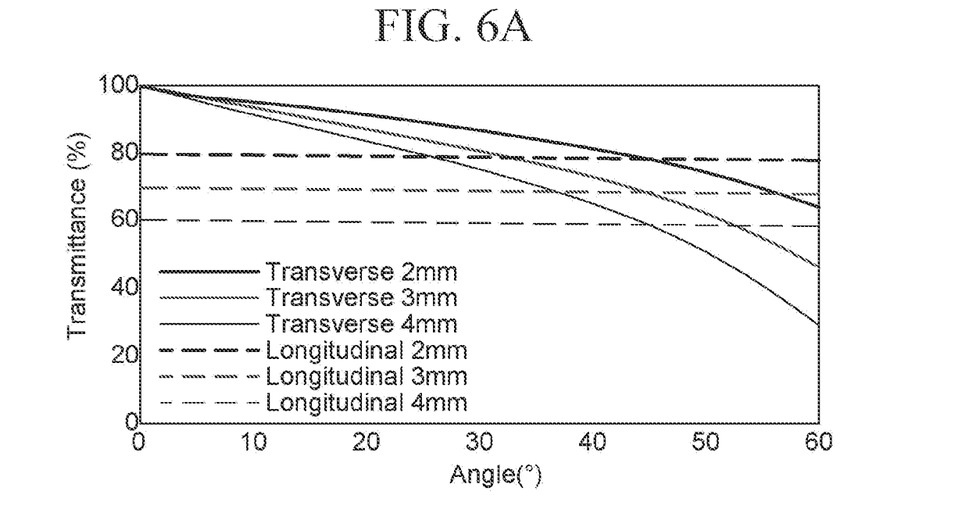
FIGS. 6A and 6B are graphs depicting collection rates that vary according to a solar cell arrangement state of a photovoltaic module of the present disclosure.
Figure 6B:
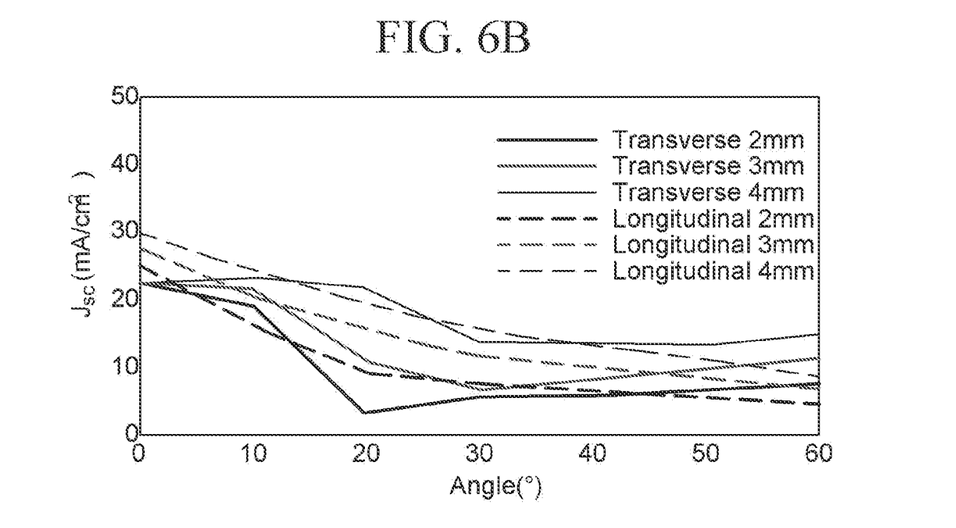
Figure 7:
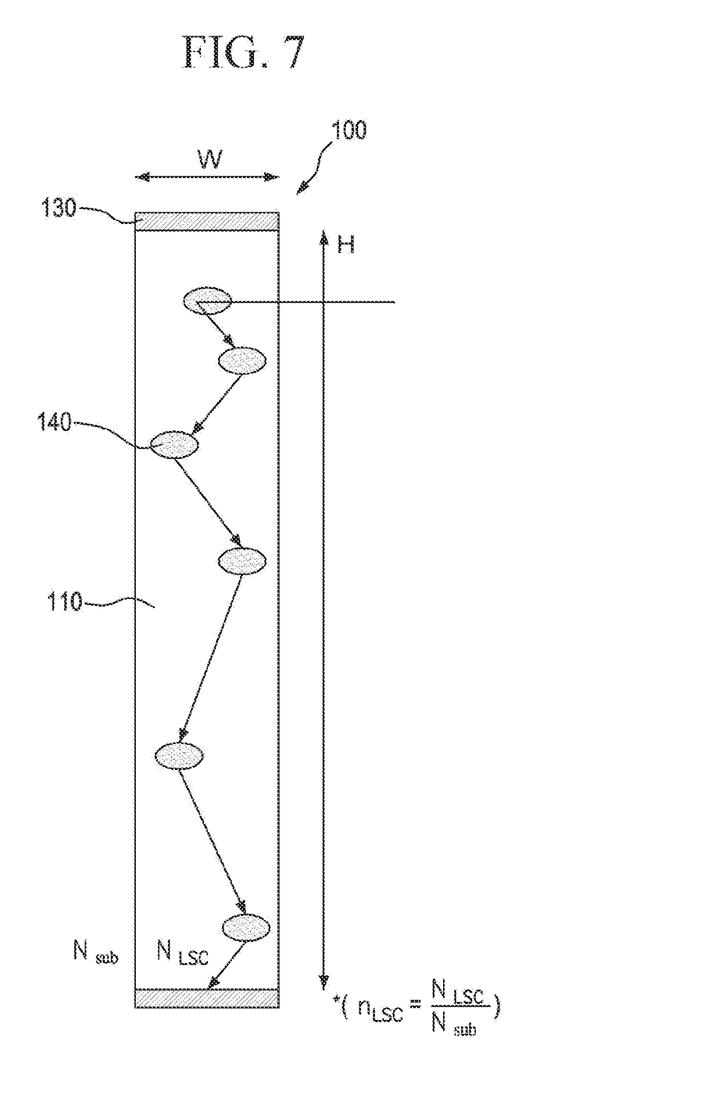
FIG. 7 is a diagram illustrating arrangement states of solar cells and concentrators of a photovoltaic module of the present disclosure.
Figure 8:
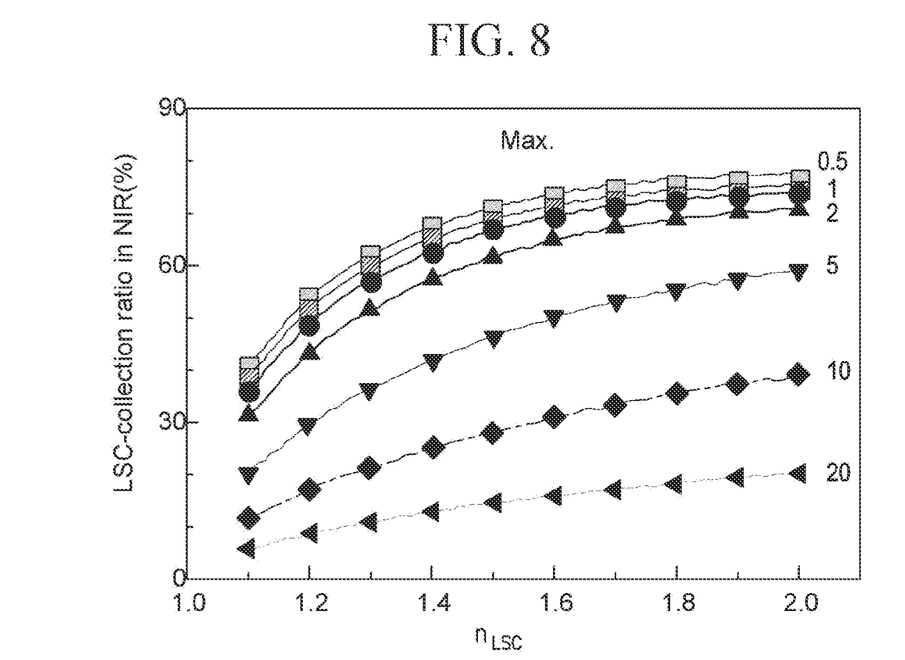
FIG. 8 is a graph depicting light collection rate states according to installation of solar cells and concentrators of a photovoltaic module of the present disclosure.

FIGS. 5A and 5B are diagrams illustrating comparison of horizontal arrangement and vertical arrangement states of solar cells. FIGS. 6A and 6B are graphs depicting collection rates that vary according to a solar cell arrangement state of a photovoltaic module of the present disclosure. FIG. 7 is a diagram illustrating arrangement states of solar cells and concentrators of a photovoltaic module of the present disclosure. FIG. 8 is a graph depicting light collection rate states according to installation of solar cells and concentrators of a photovoltaic module of the present disclosure.

Referring to FIGS. 5A, 5B, 6A, and 6B, as in Table 1 as follows, it can be seen that collection rates vary according to the vertical arrangement or the horizontal arrangement of the solar cells 130.

TABLE 1

| Incident angle of 0 degrees | Transverse 2 mm | Transverse 3 mm | Transverse 4 mm | Longitudinal 2 mm | Longitudinal 3 mm | Longitudinal 4 mm |
|---|---|---|---|---|---|---|
| Jsc (mA/cm$^2$) | 26.2 | 26.4 | 26.4 | 28.8 | 31.3 | 33.5 |
| Collection rates | 3.6 | 2.4 | 1.8 | 4 | 2.9 | 2.3 |

As in Table 1, it may be seen that the collection rate increases when the longitudinal lengths of the solar cells 130 are much larger than the transverse lengths of the solar cells 130 and thus the collection rate becomes higher in the horizontal arrangement than in the vertical arrangement.

As a result, it is preferable that the solar cells 130 are installed in the horizontal arrangement scheme in the present disclosure.

Furthermore, as illustrated in FIGS. 7 and 8, it may be seen that light collection rates become lower by 20% due to losses related to scattering of the sunlight, reemission of light, and reabsorption of light as the gaps between the solar cells 130 become larger.

As a result, the plurality of concentrators 140 may be installed between the solar cells 130 to enhance the light collection rate.

Hereinafter, a solar cell according to another embodiment of the present disclosure will be described with reference to FIGS. 9 to 12.

Meanwhile, in a description of the photovoltaic module according to the another embodiment of the present disclosure, only different configurations from the configurations of the photovoltaic module of the prior embodiment will be described in detail, and a detailed description of the same configurations and the repeated reference numerals will be omitted.

Figure 9:
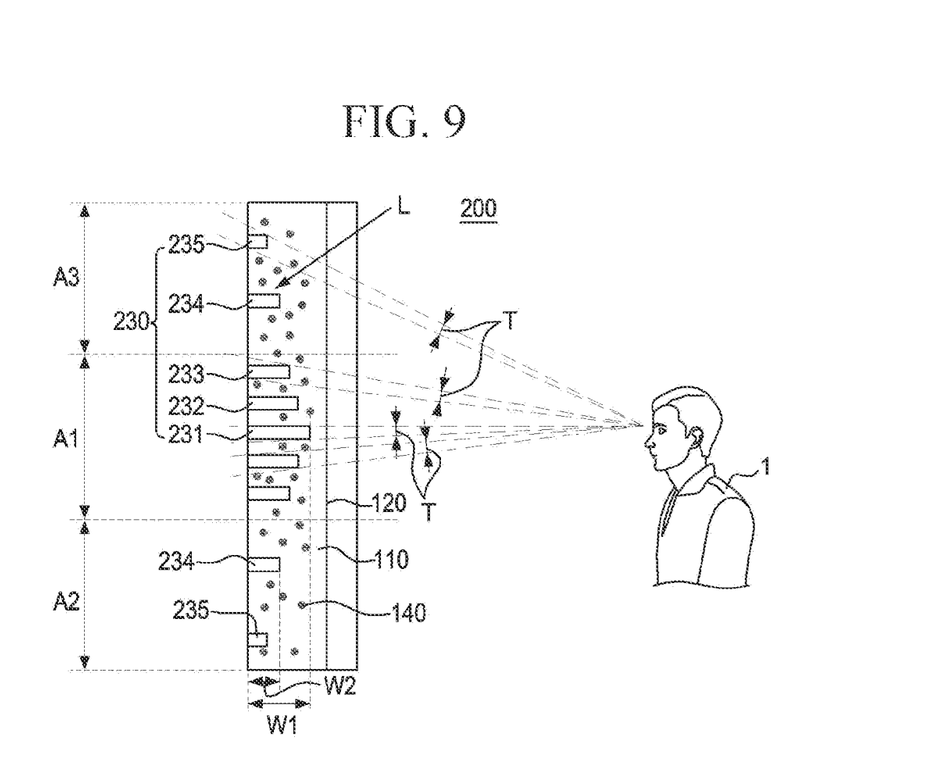
FIG. 9 is a diagram illustrating a second embodiment of a photovoltaic module of the present disclosure.

FIG. 9 is a diagram illustrating a second embodiment of a photovoltaic module of the present disclosure.

Referring to FIG. 9, a photovoltaic module 200 according to the second embodiment of the present disclosure may include the transparent material layer 110, the glass layer 120, solar cells 230, and the concentrators 140.

Hereinafter, only the configuration of the solar cells 230 will be described in detail in the description of the photovoltaic module 200 according to the second embodiment of the present disclosure.

Here, the transparent material layer 110 is divided into an intermediate area A1, a lower area A2, and an upper area A3 in a height direction.

Here, the intermediate area A1 may be defined as an area corresponding to the head of the user 1.

For example, the intermediate area A1 may be defined as an area corresponding to a distance between 1 m to 2 m from a ground surface.

Furthermore, the lower area A2 may be defined as an area from a lower end of the transparent material layer 110 to a lower end of the intermediate area A1, and the upper area A1 may be defined as an area from an upper end of the transparent material layer 110 to an upper end of the intermediate area A1.

The solar cells 230 may include a plurality of solar cells 231, 232, 233, 234, and 235 disposed in the transparent material layer 110.

As an example, the solar cells 230 may include a plurality of solar cells 231, 232, and 233 disposed in the intermediate area A1 of the transparent material layer 110, and a plurality of solar cells 234 and 235 disposed in the lower area A2 and the upper area A3.

Here, the lower area A2 and the upper area A3 may be symmetrical to each other.

Meanwhile, a spacing distance between the plurality of solar cells 231, 232, and 233 disposed in the intermediate area A1 may be smaller than a spacing distance between the plurality of solar cells 234 and 235 disposed in the lower area A2 and the upper area A3.

That is, a density of the solar cells 231, 232, and 233 disposed in the intermediate area A1 may be higher than a density of the solar cells 234 and 235 disposed in the lower area A2 and the upper area A3.

Furthermore, a width W1 of the plurality of solar cells 231, 232, and 233 disposed in the intermediate area A1 may be larger than a width W2 of the plurality of solar cells 234 and 235 disposed in the lower area A2 and the upper area A3.

Meanwhile, since the solar cells 230 have thicknesses of several nano meters to several micro meters, they may not be visible or may be recognized as very thin lines to the user 1 when they are viewed at the same height, but when the heights of the solar cells 230 are different from the height of the view point of the user 1, the recognized thicknesses of the solar cells 230 increases due to the width "W" of the solar cells 230, and thus the visibility may be degraded.

That is, the photovoltaic module 200 according to the second embodiment of the present disclosure may enhance visibility by dividing the transparent material layer 110 into the intermediate area A1, the lower area A2, and the upper area A3 in the height direction with respect to the view point of the user 1, and adjusting the width of the solar cells 230 disposed in the areas A1, A2, and A3 such that the thicknesses thereof may be viewed as the thickness "T" of nano meters in the same or very similar range at the view point of the user 1.

Furthermore, the photovoltaic module 200 according to the second embodiment of the present disclosure may enhance photovoltaic efficiency without any degradation of visibility by disposing a larger number of solar cells 230 in the intermediate area A1 having a similar height to that the view point of the user 1 than in the other areas A2 and A3.

Figure 10:
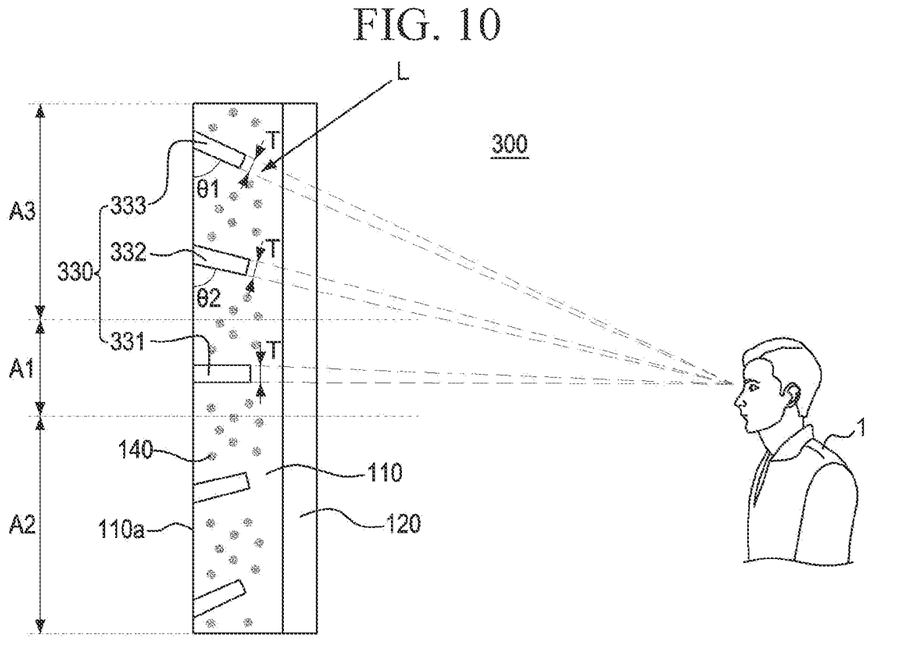
FIG. 10 is a diagram illustrating a third embodiment of a photovoltaic module of the present disclosure.

FIG. 10 is a diagram illustrating a third embodiment of a photovoltaic module of the present disclosure.

Referring to FIG. 10, a photovoltaic module 300 according to the third embodiment of the present disclosure may include the transparent material layer 110, the glass layer 120, solar cells 330, and the concentrators 140.

Hereinafter, only the configuration of the solar cells 330 will be described in detail in the description of the photovoltaic module 300 according to the third embodiment of the present disclosure.

Here, the transparent material layer 110 is divided into an intermediate area A1, a lower area A2, and an upper area A3 in a height direction.

Here, the intermediate area A1 may be defined as an area corresponding to the head of the user 1.

For example, the intermediate area A1 may be defined as an area corresponding to a distance between 1 m to 2 m from a ground surface.

Furthermore, the lower area A2 may be defined as an area from a lower end of the transparent material layer 110 to a lower end of the intermediate area A1, and the upper area A3 may be defined as an area from an upper end of the transparent material layer 110 to an upper end of the intermediate area A1.

The solar cells 330 may include a plurality of solar cells 331, 332, and 333 disposed in the transparent material layer 110.

As an example, the solar cells 330 may include the solar cells 331 disposed in the intermediate area A1 of the transparent material layer 110, and a plurality of solar cells 332 and 333 disposed in the lower area A2 and the upper area A3.

Here, the lower area A2 and the upper area A3 may be symmetrical to each other.

Meanwhile, the plurality of solar cells 331 disposed in the intermediate area A1 may be installed in a horizontal arrangement that is perpendicular to a height direction of the transparent material layer 110, and the plurality of solar cells 332 and 333 disposed in the lower area A2 and the upper area A3 may be disposed to face the intermediate area A1 to have a preset angle.

Here, angles defined by the plurality of solar cells 332 and 333 disposed in the lower area A2 and the upper area A3 and the one side surface 110a of the transparent material layer 110 may be acute angles.

Furthermore, the angle θ1 defined by the solar cells 332 disposed to be closer to the intermediate area A1 and the one side surface 110a of the transparent material layer 110 may be larger than the angle θ2 defined by the solar cells 333 disposed to be farther from the intermediate area A1 and the one side surface 110a of the transparent material layer 110.

This arrangement, as illustrated in FIG. 10, may be one, in which the plurality of solar cells 331, 332, and 333 are rotated to face the view point of the user 1.

Meanwhile, since the solar cells 330 have thicknesses of several nano meters to several micro meters, they may not be visible or may be recognized as very thin lines to the user 1 when they are viewed at the same height, but when the heights of the solar cells 330 are different from the height of the view point of the user 1, the recognized thicknesses of the solar cells 330 increases due to the width "W" of the solar cells 330, and thus the visibility may be degraded.

That is, the photovoltaic module 300 according to the third embodiment of the present disclosure may enhance visibility by dividing the transparent material layer 110 into the intermediate area A1, the lower area A2, and the upper area A3 in the height direction with respect to the view point of the user 1, and adjusting the disposition angle of the solar cells 330 disposed in the areas A1, A2, and A3 such that the thicknesses thereof may be viewed as the thickness "T" of nano meters in the same or very similar range at the view point of the user 1.

Figure 11:
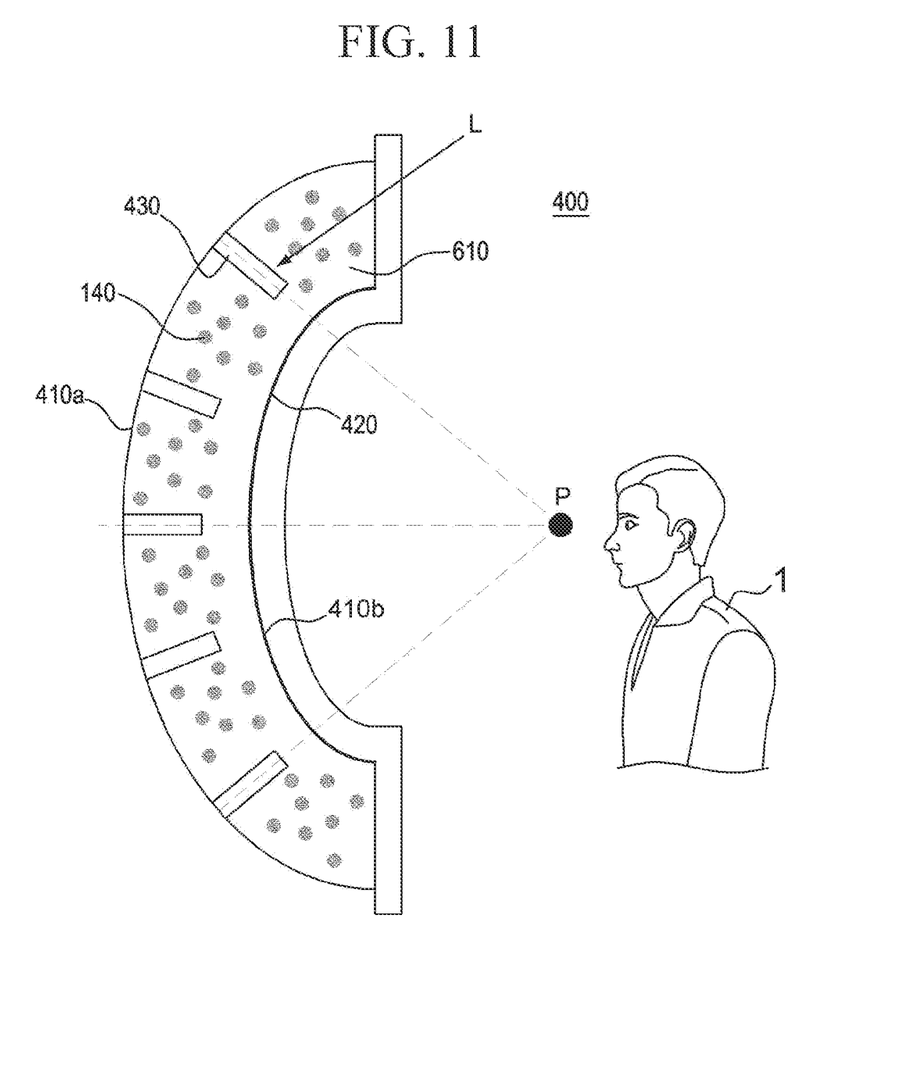
FIG. 11 is a diagram illustrating a fourth embodiment of a photovoltaic module of the present disclosure.

FIG. 11 is a diagram illustrating a fourth embodiment of a photovoltaic module of the present disclosure.

Referring to FIG. 11, a photovoltaic module 400 according to the fourth embodiment of the present disclosure may include a transparent material layer 410, a glass layer 420, solar cells 430, and the concentrators 140.

Hereinafter, only the configurations of the transparent material layer 410, the glass layer 420, and the solar cells 430 will be described in detail in the description of the photovoltaic module 400 according to the fourth embodiment of the present disclosure.

Here, the transparent material layer 410 may have a fan shape that has a preset radius of curvature with respect to an origin "P".

That is, one side surface 410a and an opposite side surface 410b of the transparent material layer 410 may have an arc.

The glass layer 420 may be disposed on the opposite side surface 410b to cover the opposite side surface 410b of the transparent material layer 410.

The solar cells 430 may be disposed to be inserted into the one side surface 410a of the transparent material layer 410, and may include a plurality of solar cells 430.

Here, the solar cells 430 may be disposed on an imaginary line that extends from the one side surface 410a of the transparent material layer 410 to the origin "P".

That is, the solar cells 430 may be disposed to face the origin "P".

Here, the origin "P" may have a similar height to the view point of the user 1.

Meanwhile, since the solar cells 430 have thicknesses of several nano meters to several micro meters, they may not be visible or may be recognized as very thin lines to the user 1 when they are viewed at the same height, but when the heights of the solar cells 430 are different from the height of the view point of the user 1, the recognized thicknesses of the solar cells 430 increases due to the width "W" of the solar cells 430, and thus the visibility may be degraded.

That is, the photovoltaic module 400 according to the third embodiment of the present disclosure may enhance visibility by adjusting the disposition angle of the solar cells 430 disposed in the transparent material layer 410 of the fan shape in the same direction with respect to the view point of the user 1 such that the thicknesses thereof may be viewed as the thickness "T" of nano meters in the same or very similar range at the view point of the user 1.

Figure 12:
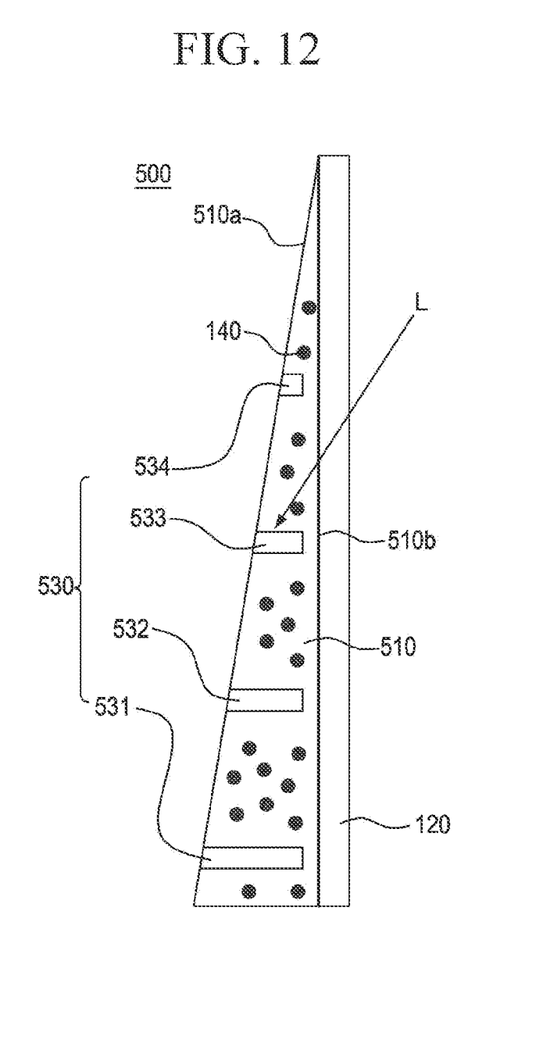
FIG. 12 is a diagram illustrating a fifth embodiment of a photovoltaic module of the present disclosure.

FIG. 12 is a diagram illustrating a fifth embodiment of a photovoltaic module of the present disclosure.

Referring to FIG. 12, a photovoltaic module 500 according to the fifth embodiment of the present disclosure may include a transparent material layer 510, the glass layer 120, solar cells 530, and the concentrators 140.

Hereinafter, only the configurations of the transparent material layer 510 and the solar cells 530 will be described in detail in the description of the photovoltaic module 500 according to the third embodiment of the present disclosure.

Here, the transparent material layer 510 may have one side surface 510a that is inclined, and an opposite side surface 510b on an opposite side thereof.

The solar cells 530 may be disposed to be inserted into the one side surface 510a of the transparent material layer 510, and may include a plurality of solar cells 531, 532, 533, and 534.

Here, the plurality of solar cells 530 may have different widths according to an inclination of the one side surface 510a of the transparent material layer 510.

That is, in the photovoltaic module 500 according to the fifth embodiment of the present disclosure may maintain or enhance photovoltaic efficiency by deforming the shapes of the plurality of solar cells 530 even when the shape of the transparent material layer 510 is deformed.

The above detailed description exemplifies the present disclosure. Furthermore, the above-mentioned contents describe the exemplary embodiment of the present disclosure, and the present disclosure may be used in various other combinations, changes, and environments. That is, the present disclosure can be modified and corrected without departing from the scope of the present disclosure that is disclosed in the specification, the equivalent scope to the written disclosures, and/or the technical or knowledge range of those skilled in the art. The written embodiment describes the best state for implementing the technical spirit of the present disclosure, and various changes required in the detailed application fields and purposes of the present disclosure can be made. Accordingly, the detailed description of the present disclosure is not intended to restrict the present invention in the disclosed embodiment state. Furthermore, it should be construed that the attached claims include other embodiments.

DESCRIPTION OF REFERENCE NUMERALS 100, 200, 300, 400, 500, 600, 700: photovoltaic module
110: transparent material layer
120: glass layer
130: solar cells
140: concentrator

The invention claimed is:

1. A photovoltaic module comprising:
   a transparent material layer; and
   a plurality of solar cells disposed a first surface of the transparent material layer extending to a second surface of the transparent material layer disposed opposite to the first surface,
   wherein at least a first one of the plurality of solar cells is disposed to be perpendicular to the first surface and the second surface of the transparent material layer,
   wherein the transparent material layer is divided into an intermediate area, a lower area, and an upper area, where each of the intermediate area, the lower area, and the upper area has a same length in a direction parallel to the first surface and the second surface of the transparent material layer,
   wherein a number of the plurality of solar cells disposed in the intermediate area is greater than a number of the plurality of solar cells disposed in the lower area or the upper area, and
   wherein the plurality of solar cells do not contact the second surface of the transparent material layer wherein the at least one of the plurality of solar cells is disposed in the lower area and the upper area and disposed to be inclined toward the intermediate area.

2. The photovoltaic module of claim 1,
   wherein the at least one of the plurality of solar cells, is disposed in the intermediate area.

3. The photovoltaic module of claim 1, wherein the first surface of the transparent material layer is curved.

4. The photovoltaic module of claim 1, further comprising:
   a glass layer disposed on the second surface of the transparent material layer.

5. The photovoltaic module of claim 4, further comprising:
   a concentrator disposed in the transparent material layer.

6. A photovoltaic module comprising:
   a transparent material layer; and
   a plurality of solar cells disposed on a first surface of the transparent material layer extending to a second surface of the transparent material layer disposed opposite to the first surface,
   wherein at least one of the plurality of solar cells is disposed to be perpendicular to the first surface and the second surface of the transparent material layer,
   wherein the transparent material layer is divided into an intermediate area, a lower area, and an upper area, where each of the intermediate area, the lower area, and the upper area has a same length in a direction parallel to the first surface and the second surface of the transparent material layer,
   wherein a number of the plurality of solar cells disposed in the intermediate area is greater than a number of the plurality of solar cells disposed in the lower area or the upper area,
   wherein the plurality of solar cells do not contact the second surface of the transparent material layer, and
   wherein an average length of the plurality of solar cells disposed in the intermediate area in a direction perpendicular to the first surface and the second surface of the transparent material layer is higher than an average length of the plurality of solar cells disposed in the lower area and the upper area in the direction perpendicular to the first surface and the second surface of the transparent material layer.

* * * * *